(12) United States Patent
Chang et al.

(10) Patent No.: US 9,659,921 B2
(45) Date of Patent: May 23, 2017

(54) POWER SWITCH DEVICE

(71) Applicant: Excelliance MOS Corporation, Hsinchu County (TW)

(72) Inventors: Yi-Chi Chang, Hsinchu County (TW); Ming-Chuan Chen, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 14/642,756

(22) Filed: Mar. 10, 2015

(65) Prior Publication Data

US 2016/0190118 A1 Jun. 30, 2016

(30) Foreign Application Priority Data

Dec. 30, 2014 (TW) .............................. 103146257 A

(51) Int. Cl.
*H01L 27/02* (2006.01)

(52) U.S. Cl.
CPC ................................ *H01L 27/0251* (2013.01)

(58) Field of Classification Search
CPC ...... H01L 27/02; H01L 27/06; H01L 27/0251
See application file for complete search history.

(56) References Cited

U.S. PATENT DOCUMENTS

| | | | |
|---|---|---|---|
| 4,829,350 A * | 5/1989 | Miller | 257/357 |
| 9,136,352 B2 * | 9/2015 | Niimura | H01L 29/063 |
| 2011/0121395 A1 * | 5/2011 | Kim | 257/361 |
| 2012/0139036 A1 * | 6/2012 | Niimura | H01L 29/063 257/329 |
| 2015/0236010 A1 * | 8/2015 | Chen et al. | H01L 27/02 |
| 2016/0027771 A1 * | 1/2016 | Su | H01L 27/0629 257/355 |

FOREIGN PATENT DOCUMENTS

| | | |
|---|---|---|
| TW | 200924165 | 6/2009 |
| TW | 201232761 | 8/2012 |

OTHER PUBLICATIONS

"Office Action of Taiwan Counterpart Application", issued on Jul. 22, 2016, p. 1-p. 7, in which the listed references were cited.

* cited by examiner

*Primary Examiner* — Marc Armand
(74) *Attorney, Agent, or Firm* — Jianq Chyun IP Office

(57) ABSTRACT

A power switch device includes a transistor and an ESD protection circuit. The transistor includes a source, a drain, and a gate, wherein a well region is disposed between the source and the drain. One end of the ESD protection circuit is coupled to the gate and another end thereof is coupled to the well region so as to form a protection circuit between the gate and the source and between the gate and the drain simultaneously.

14 Claims, 3 Drawing Sheets

POWER SWITCH DEVICE

CROSS-REFERENCE TO RELATED APPLICATION

This application claims the priority benefit of Taiwan application no. 103146257, filed on Dec. 30, 2014. The entirety of the above-mentioned patent application is hereby incorporated by reference herein and made a part of this specification.

BACKGROUND OF THE INVENTION

Field of the Invention

The invention relates to a power semiconductor device, and more particularly, to a power switch device having an electrostatic discharge (ESD) protection circuit.

Description of Related Art

A power switch device includes a trench power device and a planar power device, and since the trench power device can obtain a greater channel width and thereby significantly reduce channel resistance, the trench power switch device is currently more popular.

Referring to FIG. 1, FIG. 1 shows a circuit diagram of a known power switch device. The left figure is an NMOS equivalent circuit and the right figure is a PMOS equivalent circuit. A power switch device 10 includes a gate G, a source S, and a drain D. In particular, to prevent electrostatic discharge (ESD) from damaging the gate oxide layer, an ESD protection circuit can be disposed therein. Currently, the common power switch device adopts the form of a planar or trench transistor, and the source and the drain thereof are respectively located on two surfaces of the chip due to the gate of the chip surface. Therefore, the ESD protection circuit is generally disposed on the chip surface that the source is located, and the lines of the ESD protection circuit are respectively coupled to the gate and the source when connected.

Therefore, the ESD protection circuit in FIG. 1 can only be disposed between the gate G and the source S. However, if the drain located in the back of the chip is required to be connected to the ESD protection circuit, it is necessary to perform a more complex process to connect the ESD protection and the drain in the back of the chip, and ESD protection only be achieved for one of the drain and the source.

SUMMARY OF THE INVENTION

The invention provides a power switch device in which an ESD protection circuit can be formed in gate/source and a gate/drain simultaneously.

A power switch device of the invention includes a transistor and an ESD protection circuit. The transistor includes a source, a drain, and a gate, wherein a well region is disposed between the source and the drain. One end of the ESD protection circuit is coupled to the gate and another end thereof is coupled to the well region so as to form a protection circuit between the gate and the source and form a protection circuit between the gate and the drain.

The invention further provides a power switch device capable of protecting gate/source and a gate/drain from ESD without a complex process.

Another power switch device of the invention includes a substrate, a gate, and an ESD protection device. The substrate includes a first doped region, a second doped region, and a third doped region, wherein the first doped region forms a drain, the second doped region forms a source, and the third doped region located between the first doped region and the second doped region forms a well region. The source is located at two sides of the gate, wherein the gate includes a gate conductor and a gate insulating layer disposed between the gate conductor and the substrate. The ESD protection device is located on the substrate, and one end thereof is coupled to the gate and another end thereof is coupled to the well region so as to form a protection circuit between the gate and the source and between the gate and the drain simultaneously.

Based on the above, since the ESD protection circuit of the invention is connected from the gate to the well region between the source and the drain, during electrostatic discharge, static electricity may reach the well region via the ESD protection circuit and be released to the source and/or the drain.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
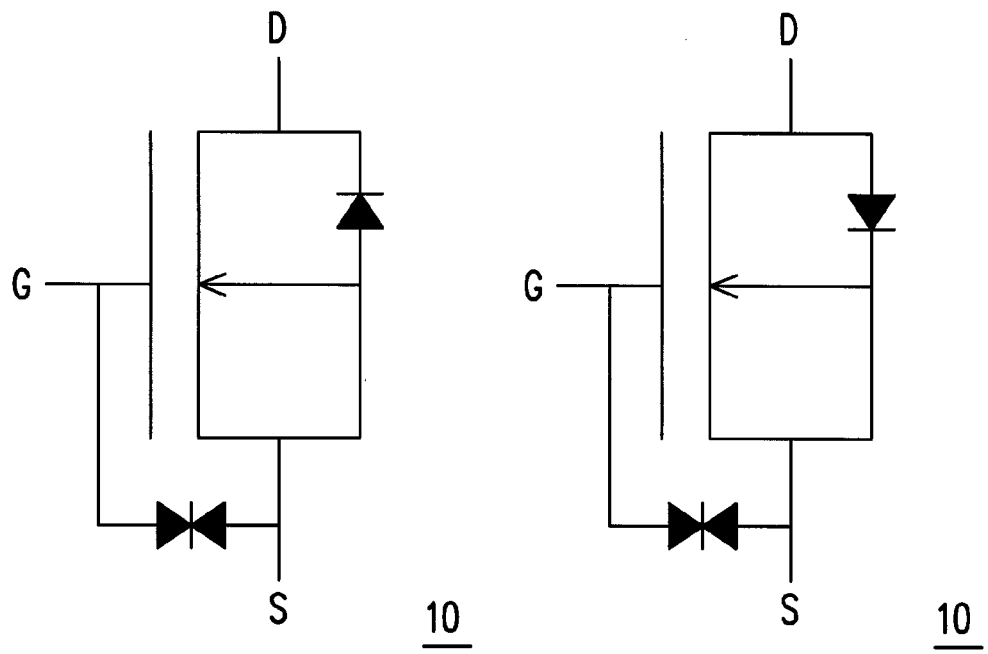
FIG. 1 is a circuit diagram of a power switch device in accordance with the related art.
Figure 2:
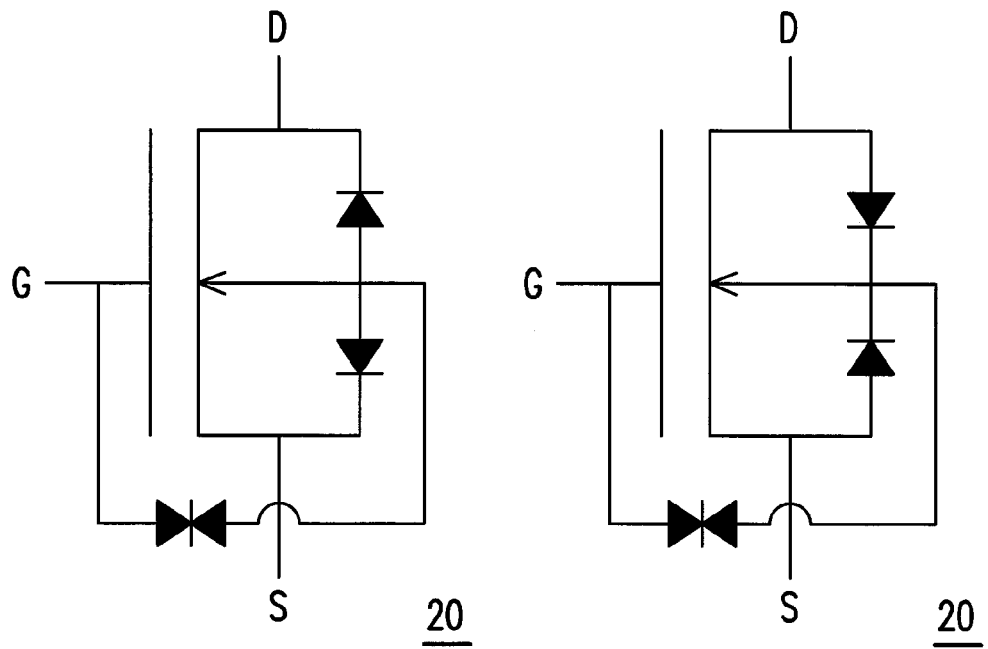
FIG. 2 is a circuit diagram of a power switch device according to the first embodiment of the invention.

FIG. 2 is a circuit diagram of a power switch device according to the first embodiment of the invention. The left figure is an NMOS equivalent circuit and the right figure is a PMOS equivalent circuit.

Referring to FIG. 2, a power switch device 20 of the first embodiment includes a transistor and an electrostatic discharge (ESD) protection circuit. The transistor includes a source S, a drain D, and a gate G, wherein a well region is disposed between the source S and the drain D. One end of the ESD protection circuit is coupled to the gate G, and another of the ESD protection circuit is coupled to the well region. Accordingly, one protection circuit is formed between the gate G and the source S, and another protection circuit is formed between the gate G and the drain D. At this point, the source S is not coupled to the well region, i.e. the source S and the well region are uncoupled to each other. More specifically, if electrostatic discharge occurs between the gate G and the source S, static electricity can reach the well region via the ESD protection circuit and be released to the source S; and if electrostatic discharge occurs between the gate G and the drain D, static electricity can similarly reach the well region via the ESD protection circuit and be released to the drain D. Therefore, the ESD protection circuit of the present embodiment can protect the gate insulating layer of each of the gate/source and the gate/drain from ESD. In the present embodiment, the ESD protection circuit is, for instance, a resistor, a diode, a bipolar device, a silicon-controlled rectifier (SCR) device, or other structures or devices having ESD protection function. The transistor of the present embodiment may be a planar transistor or a trench transistor, for example. Moreover, the power switch device 20 generally further includes an edge termination region surrounding the transistor. The ESD protection circuit can be disposed between the transistor and the edge termination region.

Figure 3:
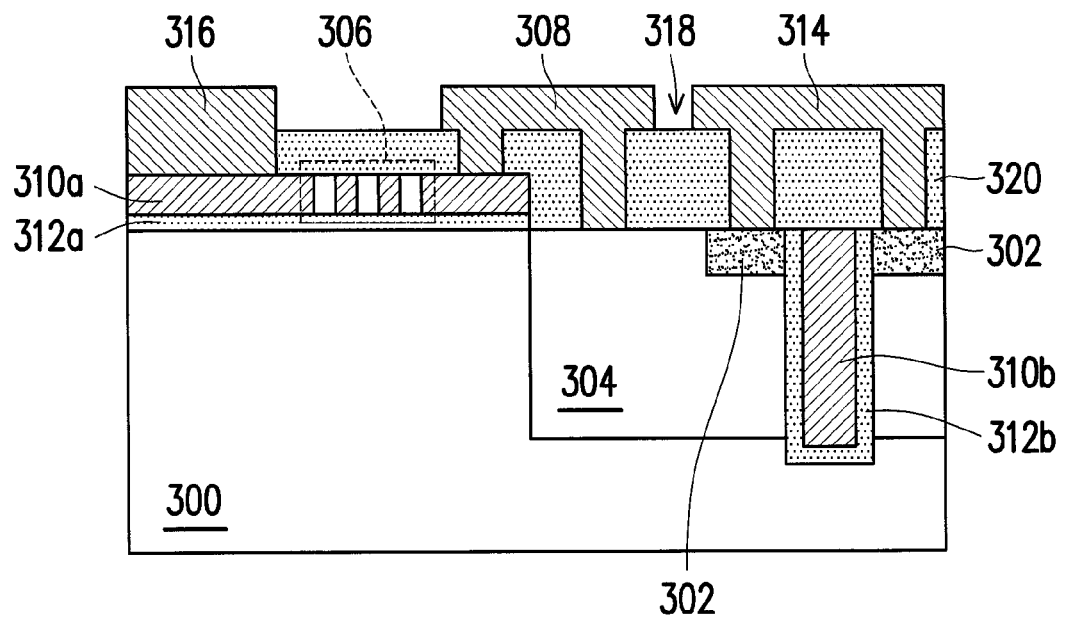
FIG. 3 is a structural schematic of a power switch device according to the second embodiment of the invention.

FIG. 3 is a structural schematic of a power switch device according to the second embodiment of the invention.

Referring to FIG. 3, the power switch device of the second embodiment actually reflects the circuit of the first embodiment, and includes a substrate formed by a first doped region 300, a second doped region 302, and a third doped region 304, an ESD protection device 306, and a gate. In particular, the first doped region 300 is used as a drain, the second doped region 302 is used as a source, and the third doped region 304 located between the first and second doped regions 300 and 302 is used as a well region. The gate is, for instance, a trench gate, and includes, for instance, a gate conductor 310b and a gate insulating layer 312b disposed between the gate conductor 310b and a trench, wherein the trench passes through the second and third doped regions 302 and 304 and is in contact with the first doped region 300. The ESD protection device 306 is located on the substrate (i.e., located on the same surface as the second doped region 302), and one end of the ESD protection device 306 is coupled to the third doped region 304 (well region) via a well region conductor structure 308, another end of the ESD protection device 306 is coupled to the gate conductor 310b via a gate conductor 310a, wherein the gate conductor 310a and the first doped region 300 (source) are isolated by an insulating layer 312a in between, and the gate conductors 310a and 310b are, for instance, made by polysilicon or metal, but the invention is not limited thereto.

Via the structure of FIG. 3, a protection circuit can be formed between the trench gate and the source and between the trench gate and the drain simultaneously. The ESD protection device 306 is, for instance, a p-n-p-n silicon-controlled rectifier (SCR), but the invention is not limited thereto. The ESD protection device of the present embodiment can also be, for instance, a resistor, a diode, a bipolar device, etc. Moreover, the power switch device of the second embodiment can further include an edge termination region (not shown) surrounding the third doped region 304 (well region), and the ESD protection device 306 can be disposed between the third doped region 304 (well region) and the edge termination region, such that the main design of the device is not affected, and electrostatic discharge can also be rapidly released.

In FIG. 3, the second doped region 302 (source) can be electrically connected via a source metal structure 314. Moreover, the source metal structure 314 and the well region conductor structure 308 can pass through a circuit formed by the same photomask process, and if a cut-off portion 318 is formed therebetween, the well region conductor structure 308 can be connected only to the ESD protection device 306 and the third doped region 304 (well region), and the source metal structure 314 can be connected only to the second doped region 302 (source). Moreover, when the source metal structure 314 and the well region conductor structure 308 are formed, a gate metal structure 316 can be further formed on the gate conductor 310a simultaneously, and therefore an additional process is not needed. In the present embodiment, the first doped region 300 is, for instance, a first conductivity type epitaxial layer (such as an N-epitaxy), the second doped region 302 is, for instance, a first conductivity type source region (such as an N+ doped region), and the third doped region 304 is, for instance, a second conductivity type well region (such as a P-type region).

Moreover, the source metal structure 314 generally has a conductive plug disposed perpendicular to the substrate and passing through a dielectric layer 320 and connected to the second doped region 302, wherein a barrier layer (not shown) may be disposed between the source metal structure 314, the dielectric layer 320, and the second doped region 302, and the material of the barrier layer is, for instance, Ti/TiN.

Figure 4:
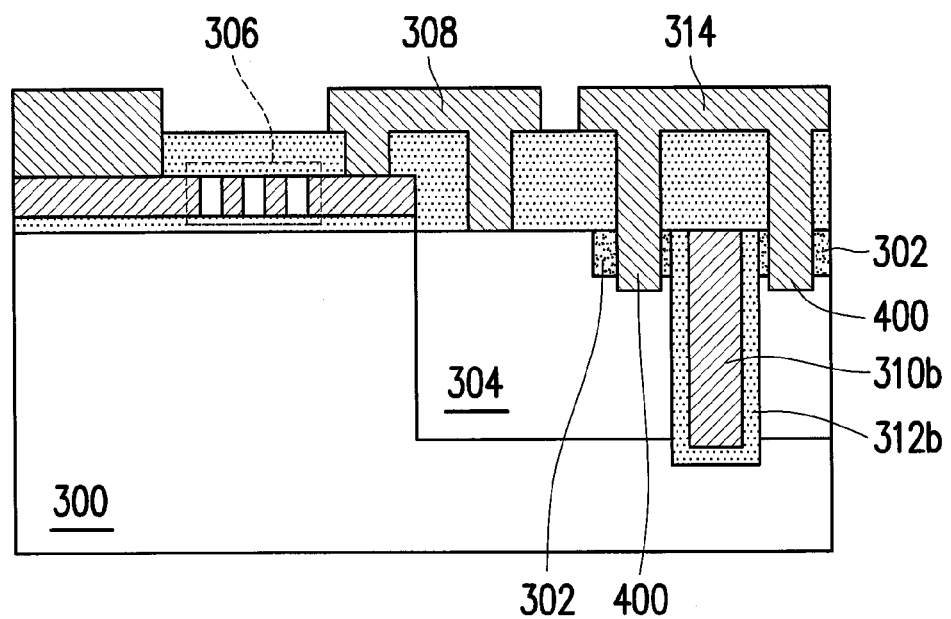
FIG. 4 is a structural schematic of a variation of the power switch device of FIG. 3.

FIG. 4 is a structural schematic of a variation of the power switch device of FIG. 3. In FIG. 4, the same reference numerals as FIG. 3 are used to represent the same components, wherein a conductive plug 400 of the source metal structure 314 passes through the source (i.e., second doped region 302) and is electrically connected to the well region (i.e., third doped region 304), and when the third doped region 304 is, for instance, a second conductivity type well region (such as a P-type region), a heavily-doped region (such as a P+ doped region) can further be added to the bottom portion of the conductive plug 400 inside the third doped region 304.

Figure 5:
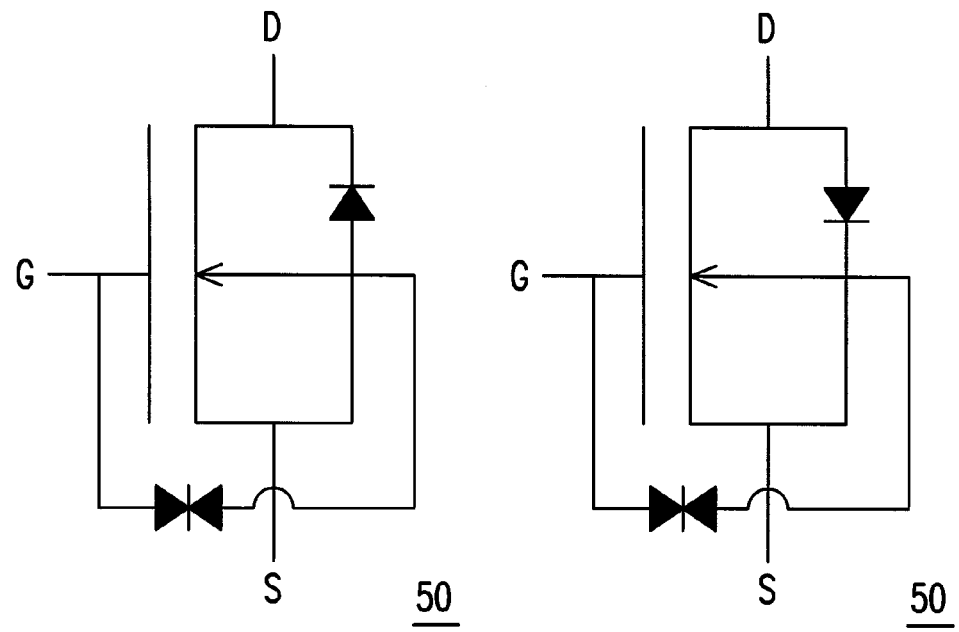
FIG. 5 is a circuit diagram of the power switch device of FIG. 4.

The power switch device of FIG. 4 is as shown in FIG. 5. The left figure is an NMOS equivalent circuit and the right figure is a PMOS equivalent circuit. In FIG. 5, the source S is coupled to the well region, and therefore if electrostatic discharge occurs, static electricity still reaches the well region via the ESD protection circuit and is released to the source S and the drain D.

Figure 6:
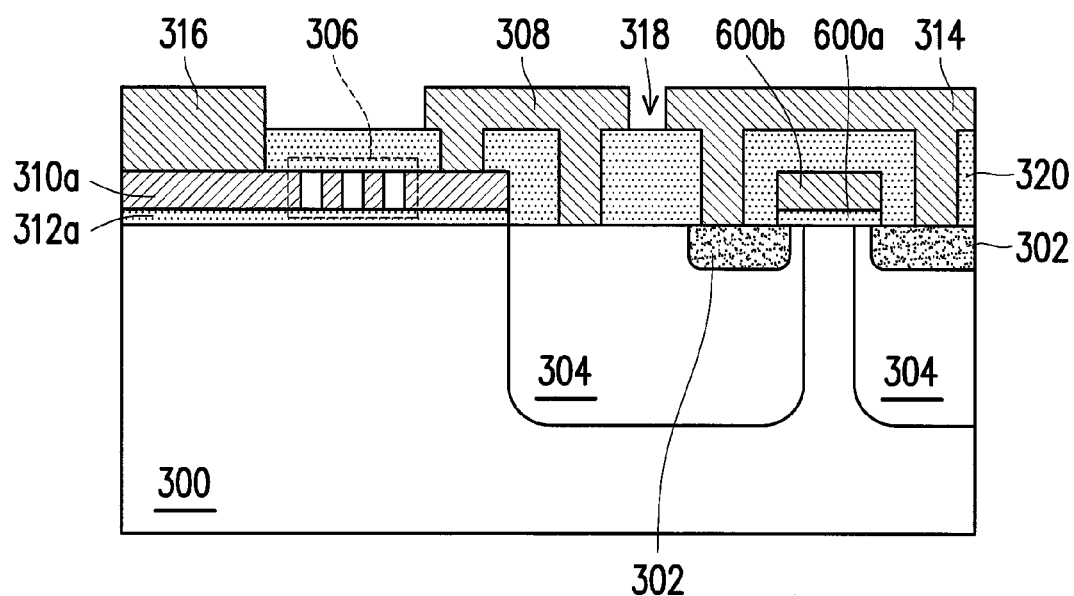
FIG. 6 is a structural schematic of another variation of the power switch device of FIG. 3.

FIG. 6 is a structural schematic of another variation of the power switch device of FIG. 3. In FIG. 6, the same reference numerals as FIG. 3 are used to represent the same components, wherein the difference between FIG. 6 and FIG. 3 is that a planar transistor is used in FIG. 6, and therefore a planar gate is adopted in FIG. 6, and the planar gate has a gate insulating layer 600a and a gate conductor 600b. The second doped region 302 (source) is located at two sides of the gate, and the third doped region 304 (well region) is still located between the first doped region 300 (drain) and the second doped region 302 (source). Therefore, one end of the ESD protection device 306 is similarly coupled to the third doped region 304 (well region) via the well region conductor structure 308, and another end of the ESD protection device 306 can similarly be coupled to the gate conductor 600b via the gate conductor 310a to achieve ESD protection for the gate/source and the gate/drain simultaneously. Moreover, in the present figure, the conductive plug 400 of the source metal structure 314 is in contact with the source (i.e., second doped region 302), but can also pass through the source (i.e., second doped region 302) and be electrically connected to the well region (i.e., third doped region 304) as shown in FIG. 4.

Based on the above, in the invention, the ESD protection circuit is coupled to the gate and the well region (also referred to as a base), and therefore, during electrostatic discharge, static electricity can reach the well region via the ESD protection circuit and be released to the source and/or the drain. As a result, a protection circuit is formed between the gate and the source and between the gate and the drain simultaneously, and an additional and complex process or circuit design is also not needed.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A power switch device, comprising:
a transistor formed on a substrate, the transistor comprises a source, and a drain in the substrate, and a gate on the substrate, wherein a well region is disposed between the source and the drain in the substrate; and
an ESD protection circuit, located on the substrate, wherein one end of the ESD protection circuit is coupled to the gate and another end thereof is coupled to the well region so as to form a protection circuit between the gate and the source and between the gate and the drain simultaneously.

2. The power switch device of claim 1, wherein the ESD protection circuit comprises a resistor, a diode, a bipolar device, or a silicon-controlled rectifier device.

3. The power switch device of claim 1, further comprising an edge termination region surrounding the transistor.

4. The power switch device of claim 1, wherein the source is coupled to the well region.

5. The power switch device of claim 1, wherein the transistor comprises a planar transistor or a trench transistor.

6. The power switch device of claim 3, wherein the ESD protection circuit is disposed between the transistor and the edge termination region.

7. A power switch device, comprising:
a substrate, comprising a first doped region, a second doped region, and a third doped region, wherein the first doped region forms a drain, the second doped region forms a source, and the third doped region located between the first doped region and the second doped region forms a well region;
a gate, comprising a gate conductor and a gate insulating layer disposed between the gate conductor and the substrate, and the source is located at two sides of the gate; and
an ESD protection device located on the substrate, wherein one end of the ESD protection device is coupled to the gate, another end of the ESD protection device is coupled to the well region, and thereby a protection circuit is formed between the gate and the source and between the gate and the drain simultaneously.

8. The power switch device of claim 7, wherein the ESD protection device comprises a resistor, a diode, a bipolar device, or a silicon-controlled rectifier device.

9. The power switch device of claim 7, further comprising an edge termination region surrounding the well region.

10. The power switch device of claim 7, further comprising a source metal structure electrically connected to the source.

11. The power switch device of claim 7, wherein the gate comprises a planar gate or a trench gate.

12. The power switch device of claim 9, wherein the ESD protection device is disposed between the well region and the edge termination region.

13. The power switch device of claim 10, wherein the source metal structure passes through the source and is electrically connected to the well region.

14. The power switch device of claim 11, wherein the trench gate is located inside a trench passing through the second doped region and the third doped region and in contact with the first doped region, and the gate insulating layer is disposed between the gate conductor and the trench.

* * * * *